United States Patent
Aggarwal et al.

(10) Patent No.: US 9,136,815 B2
(45) Date of Patent: *Sep. 15, 2015

(54) METHODS AND APPARATUSES FOR IMPLEMENTING VARIABLE BANDWIDTH RF TRACKING FILTERS FOR RECONFIGURABLE MULTI-STANDARD RADIOS

(71) Applicant: Nokia Corporation, Espoo (FI)

(72) Inventors: Sudhir Aggarwal, Fremont, CA (US); Xiao Xiao, Berkeley, CA (US)

(73) Assignee: Nokia Technologies Oy, Espoo (FI)

( * ) Notice: Subject to any disclaimer, the term of this patent is extended or adjusted under 35 U.S.C. 154(b) by 135 days.

This patent is subject to a terminal disclaimer.

(21) Appl. No.: 13/852,512

(22) Filed: Mar. 28, 2013

(65) Prior Publication Data

US 2013/0335163 A1    Dec. 19, 2013

Related U.S. Application Data

(63) Continuation-in-part of application No. 13/495,489, filed on Jun. 13, 2012.

(51) Int. Cl.
   *H03H 7/12*    (2006.01)
   *H03H 19/00*   (2006.01)

(52) U.S. Cl.
   CPC .............. *H03H 7/12* (2013.01); *H03H 19/002* (2013.01)

(58) Field of Classification Search
   CPC ......... H04J 3/047; H04B 1/0003; H03H 7/00; H03H 7/0161; H03H 7/12
   USPC ............ 370/537, 290, 48, 497; 333/167, 172; 455/334, 339, 340
   See application file for complete search history.

(56) References Cited

U.S. PATENT DOCUMENTS

| | | | |
|---|---|---|---|
| 3,603,898 A * | 9/1971 | Dawson et al. | 333/173 |
| 5,491,453 A * | 2/1996 | Ichihara | 327/553 |
| 5,525,940 A | 6/1996 | Heikkila et al. | 333/17.1 |
| 5,724,000 A * | 3/1998 | Quinn | 327/554 |
| 8,149,742 B1 | 4/2012 | Sorsby | 370/278 |
| 2004/0095951 A1 | 5/2004 | Park | 370/437 |
| 2008/0136473 A1* | 6/2008 | Bollenbeck et al. | 327/156 |
| 2009/0002066 A1* | 1/2009 | Lee et al. | 327/554 |
| 2011/0075593 A1 | 3/2011 | Chen et al. | 370/280 |
| 2012/0214435 A1 | 8/2012 | Javor et al. | 455/141 |

OTHER PUBLICATIONS

Darvishi, Milad; A 0.3-to-1.2GHz Tunable 4th-Order Switched gm-C Bandpass Filter with >55dB Ultimate Rejection and Out-of-Band IIP3 of +29dBm; Feb. 23, 2014; Solid-State Circuits Conference Digest of Technical Papers (ISSCC), 2012 IEEE International.*
Ghaffari, Amir; Tunable High-Q N-Path Band-Pass Filters; May 2011; IEEE Journal of Solid-State Circuits; vol. 46; pp. 1-12.*
Darvishi et al, "A 0.3 to 1,2GHz Tunable $4^{th}$-Order Switch gm-C Bandpass Filter with >55dB Ultimate Rejection and Out-of-Band IIP3 of +29dBm", 2012 IEEE International Solid-State Circuits Conference, ISSCC, Apr. 2012, Session 21, Analog Techniques, 21,1.
Ghaffari, Amir, Tunbale High-Q N-Path Band-Pass Filers, May 2011, IEEE, Journal of Solid-State Circuits, vol. 46, pp. 1-12.
* cited by examiner

*Primary Examiner* — Pao Sinkantarakorn
*Assistant Examiner* — Stephen Steiner
(74) *Attorney, Agent, or Firm* — Harrington & Smith

(57) ABSTRACT

A variable bandwidth filter includes a first filter branch in parallel with a second filter branch. The first filter branch includes a first resistance in series with an input and a first output, and N parallel paths across the first output. The second filter branch includes a second resistance in series with the input and a second output, and N parallel paths across the second output. A clock tunes the first and second filter branches to a center frequency. A combiner produces a difference signal including a difference between the output of the first filter branch and the output of the second filter branch to provide a filter output having an adjustable bandwidth with reference to a center frequency. The bandwidth is adjusted by changing a value of at least one resistor or at least one capacitor in one or more of the first filter branch or the second filter branch.

18 Claims, 12 Drawing Sheets

METHODS AND APPARATUSES FOR IMPLEMENTING VARIABLE BANDWIDTH RF TRACKING FILTERS FOR RECONFIGURABLE MULTI-STANDARD RADIOS

RELATED APPLICATIONS

The present application is a continuation-in-part of co-pending U.S. application Ser. No. 13/495,489, entitled "Method and Device for Implementing Tracking Filters and RF Front End of Software Defined Radios", filed on Jun. 13, 2012, the disclosure of which is hereby incorporated by reference in its entirety.

TECHNICAL FIELD

The exemplary and non-limiting embodiments of this invention relate generally to wireless communication methods and apparatuses and, more specifically to radio-frequency filters such as variable bandwidth, radio frequency tracking filters for reconfigurable multi-standard radios.

BACKGROUND

Software defined radios offer the promise of wider capability in a smaller hardware footprint. This has become more important in cellular handsets as customers demand a wider variety of radio capabilities in a single mobile terminal while still expecting the handset to fit neatly in a pocket. These software-defined radios operate over a wide range of frequencies to implement multi-mode and multi-band functionality for cellular and data connectivity applications. However, current technological limitations have prevented realization of widely tunable radio-frequency (RF) front-end circuits for multi-band radios. Such multi-band radios are increasingly required by certain cellular radio access technologies (RAT) such as evolved Universal Terrestrial Radio Access Network (E-UTRAN, also known as long term evolution or LTE).

In the typical radio frequency (RF) front end, the first component after the antenna is a multi-band switch/diplexer followed by a duplexer. In existing handsets, many duplexers may be used depending upon the number of respective receive/transmit bands and their corresponding bandwidths. The duplexer provides isolation between a transmitter and a receiver, to thereby enable the same antenna to be used for both transmitting and receiving. The transmit signal has a very high power, up to 33 dBm, while the receiver is required to pick up signals as low as −109 dBm. Therefore, the transmitted signal has to be isolated from the received signal even though the transmitter and the receiver may be operating in different frequency bands. In addition to leakage from the transmitter, to the receiver, there may be other blocking signals in the vicinity of the desired signal that also need to be suppressed. Typically, the transmit and receive frequencies are not widely separated, so in practice, about 50 dB of isolation is required between the transmitter and the receiver. This degree of isolation is usually provided by means of a surface acoustic wave (SAW) filter that operates over a limited band of frequencies.

While a SAW filter may be sufficient for operation across a limited frequency band as occurs, for example, in UTRAN, the SAW filter is too cumbersome, costly, large, narrowband and inefficient for use in more advanced RATs such as LTE. SAW filters provide a significant insertion loss on the order of 2 or 3 dB which negatively impacts the sensitivity and noise figure of a receiver. Likewise, a significant portion of the transmitted output power will be dissipated as heat in the SAW filter. The SAW filter has several drawbacks which render it not ideally suited for use in the RF front end of a software defined radio. In addition to the aforementioned drawbacks, SAW filters may occupy too much of the available area on a printed circuit board which impacts the form factor of the host mobile device. Moreover, SAW filters may not adequately suppress undesired signals close in frequency to the desired signal, yet this reception condition is fairly commonplace in multi-band and multi-mode smart-phones.

A single radio transceiver is desirable both for cellular and data connectivity applications. With the opening of several new frequency bands for cellular applications, a reconfigurable multi-standard radio is required to work over a wide range of frequencies. Currently, if a handset is configured to implement more than one standard such as GSM, WCDMA, LTE, or WiFi, the handset may be equipped with separate RF transceivers for implementing each of the standards. Moreover, a multi-standard radio may be required to receive signals which have two or more different bandwidths.

Other relevant teachings include U.S. Pat. No. 3,603,898 by John H. D. Chelmsford et al.; UK Patent No. 1,341,182 by Michael A. Kaufman; and a paper by Milad Darvishi et al. at section 21.1 (Analog Techniques, pages 358-359) of 2012 IEEE International Solid State Circuits Conference.

SUMMARY

According to a first set of exemplary embodiments of the invention, a variable bandwidth radio frequency tracking filter comprises a first filter branch in parallel with a second filter branch. The first filter branch may comprise a first resistance in series with an input and a first output, and a first plurality of N parallel paths across the first output, each of respective paths of the first plurality of N parallel paths comprising a corresponding capacitor in series with a corresponding switch and a common terminal. The second filter branch may comprise a second resistance in series with the input and a second output, and a second plurality of N parallel paths across the second output, each of respective paths of the second plurality of N parallel paths comprising a corresponding resistor-capacitor (RC) network in series with a corresponding switch and a common terminal. A clock may tune the first and second filter branches to a center frequency by controlling the switches of the first and second filter branches to switch at the center frequency. A combiner may produce a difference signal comprising a difference between the output of the first filter branch and the output of the second filter branch; the difference signal providing a filter output for the tracking filter having an adjustable filter bandwidth with reference to a center frequency. The filter bandwidth may be adjusted by changing a value of at least one resistor or at least one capacitor in one or more of the first filter branch or the second filter branch.

According to another set of exemplary embodiments of the invention, a method of controlling a variable bandwidth radio frequency tracking filter comprises providing a first filter branch in parallel with a second filter branch. The first filter branch may comprise a first resistance in series with an input and a first output, and a first plurality of N parallel paths across the first output, each of respective paths of the first plurality of N parallel paths comprising a corresponding capacitor in series with a corresponding switch and a common terminal. The second filter branch may comprise a second resistance in series with the input and a second output, and a second plurality of N parallel paths across the second parallel paths comprising a corresponding resistor-capacitor (RC) network in series with a corresponding, switch and a common terminal. The filter may be adjusted by using a clock to tune the first and second filter branches to a center frequency by controlling the switches of the first and second filter branches to switch at the center frequency. A difference signal may be produced by comprising a difference between the output of the first filter branch and the output of the second filter branch; the difference signal providing a filter output for the tracking filter having an adjustable filter bandwidth with reference to a center frequency. The filter bandwidth may be adjusted by changing a value of at least one resistor or at least one capacitor in one or more of the first filter branch or the second filter branch.

Pursuant to a set of further embodiments of the invention, the clock signals that control all the switches of the N paths in the first filter branch may have the same frequency and the same first on-duration and a different phase with reference to the clock signals that selectively control all the switches of the N paths in the second filter branch. Additionally or alternatively, the clock applies a first on-time duration to the first filter branch and a second on-time duration to the second filter branch, wherein the first on-time is not equal to the second on-time. The clock signals that selectively control all the switches of the N paths in the first and second filter branches all have the same frequency and the same second on-duration but these clock signals use a plurality of different phases, such that each of respective switches in the first filter branch are paired with a corresponding switch of the switches in the second filter in accordance with the clock signals having a common phase.

According to a set of further embodiments of the invention, the tracking filter may further include a splitter for applying a same input signal to the input of the first filter branch and the input of the second filter branch.

According to a set of further embodiments of the invention, N=4 and there may be a total of four different phases of the clock signal selectively controlling the switches in the first filter branch and the switches in the second filter branch. Alternatively or additionally, the first sub-circuit in each path of the first filter may be identical to the second sub-circuit in each path of the second filter. Alternatively or additionally, a first sub-circuit in each of the N paths of the first filter branch may be different from a second sub-circuit in each of the N paths of the second filter branch. Each of these sub-circuits may be implemented, for example, as a capacitor or an RC sub-circuit or an LC sub-circuit or an RLC sub-circuit, to name a few non-limiting examples. In embodiments where the first and second sub-circuits are different, the first and second on-time durations may be identical in one set of embodiments or they may be different in another set of embodiments.

Non-limiting examples of practical deployments of the tracking filter include a filter circuit that is operatively disposed in a radio device between an antenna and one or both of a receiver and a transmitter; and/or embodied in a RF front end chip, and/or more generally as part of an electronic radio device.

These and other aspects are detailed further below.

DETAILED DESCRIPTION

A multi-standard radio is required to receive signals that may have any of several different bandwidths. To receive such signals, an RF front-end filter with variable bandwidth is required. Further, it is preferred that the filter tracks the frequency of the received signal. As indicated previously, existing SAW filters are not well suited for use in multi-standard radios.

Proposed replacements for the SAW filter include a quality factor(Q)-enhanced inductor-capacitor (LC) resonator and an N-path filter (N being an integer greater than one). The Q-enhanced LC resonator filters incoming signals by means of the resonant frequency of the inductor-capacitor combination. But, depending upon the Q of the resonator and various other factors, this filtering may be possible for only a narrow band of frequencies. Such an approach is primarily useful for single-band radios, and is not well suited for wideband multi-standard radio devices. The N-path filter is a transferred impedance filter (TIF) that performs filtering of incoming signals along any of a plurality of parallel paths by using a feedback or feed-forward translational loop.

Figure 1:
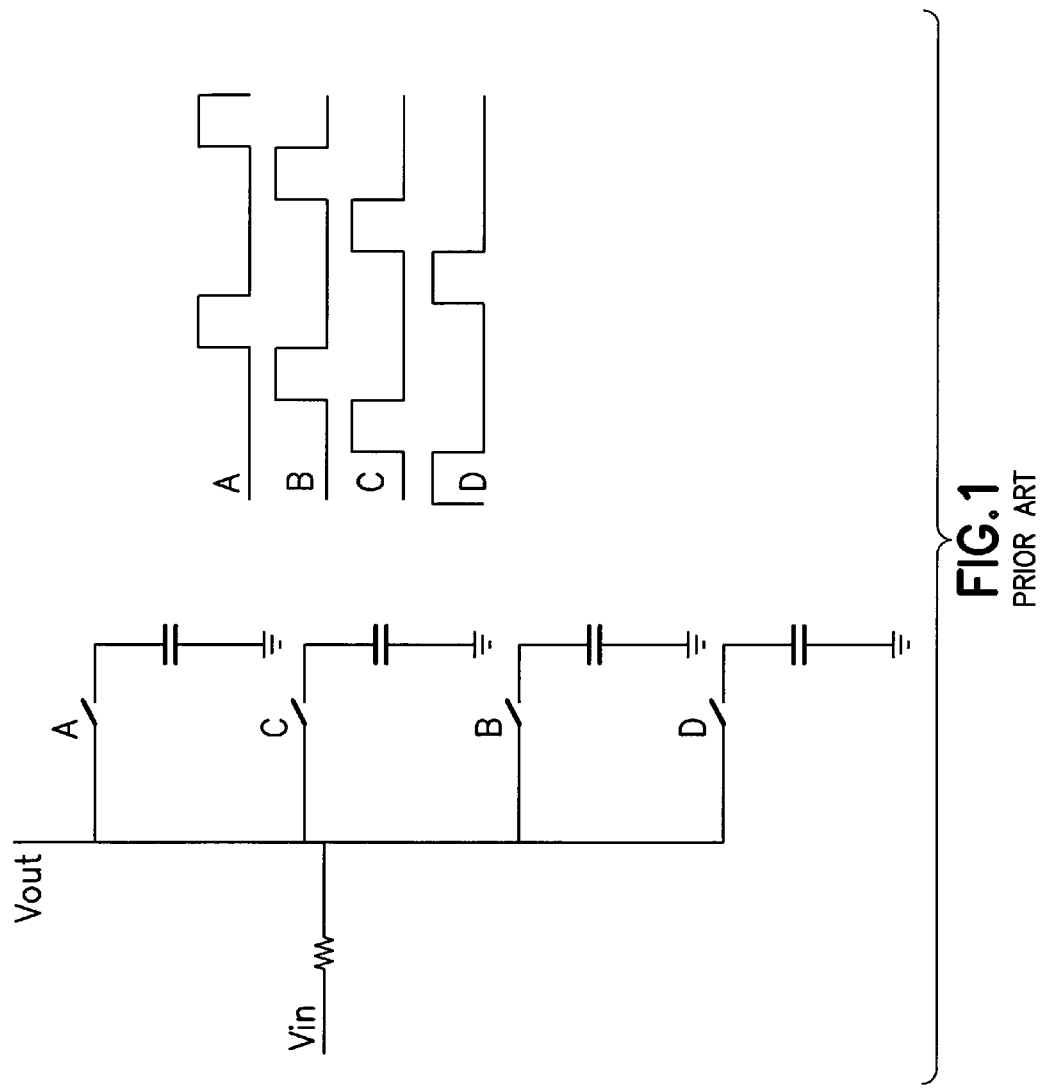
FIG. 1 is a rendition of a prior art four-phase capacitive filter used as an N-path filter.

FIG. 1 is a circuit schematic illustrating in general a conventional N-path filter, using capacitors switched with a four-phase clock. This filter may be used as a tracking filter because the band pass characteristics at the local oscillator (LO) frequency may be made to track by varying the frequency. For this type of filter, out-of-band rejection is limited to only about 15 dB. Noise folding and on-resistances of the switches stand as two of the practical limitations for achieving a higher out-of-band rejection.

One may improve the out-of-band rejection with respect to the configuration of FIG. 1 by employing two filters centered on slightly different frequencies but providing the same bandwidth. These filters may then have a second order response with a rejection slope of 20 db/decade. Subtracting the response of these two filters may yield a fourth order filter with a rejection slope of 40 dB/decade. In this configuration, the limitation of achievable rejection by the switch resistances may also be reduced because in the ideal case the effect of the switch resistances also cancels. For the subtraction based filter, the rejection may be a function of mismatch in switch resistances.

In the case of four phase tracking filters, different approaches may be employed to make the center frequencies slightly different. The difference in center frequencies may be enabled by having two sets of four phase clock generators differing slightly in the frequency. They may have a tendency to pull towards each other. Another possibility for differing center frequencies is to use 16-phase switched capacitors, but this adds to complexity and folding of the blockers at the sixteenth multiple of the clocks. A third technique for enabling different center frequencies is to use poly-phase gm cells in the baseband region to shift the admittance frequency. But this is seen to add considerable noise of transconductances, rendering the filter not very useful at RF frequencies.

Figure 2:
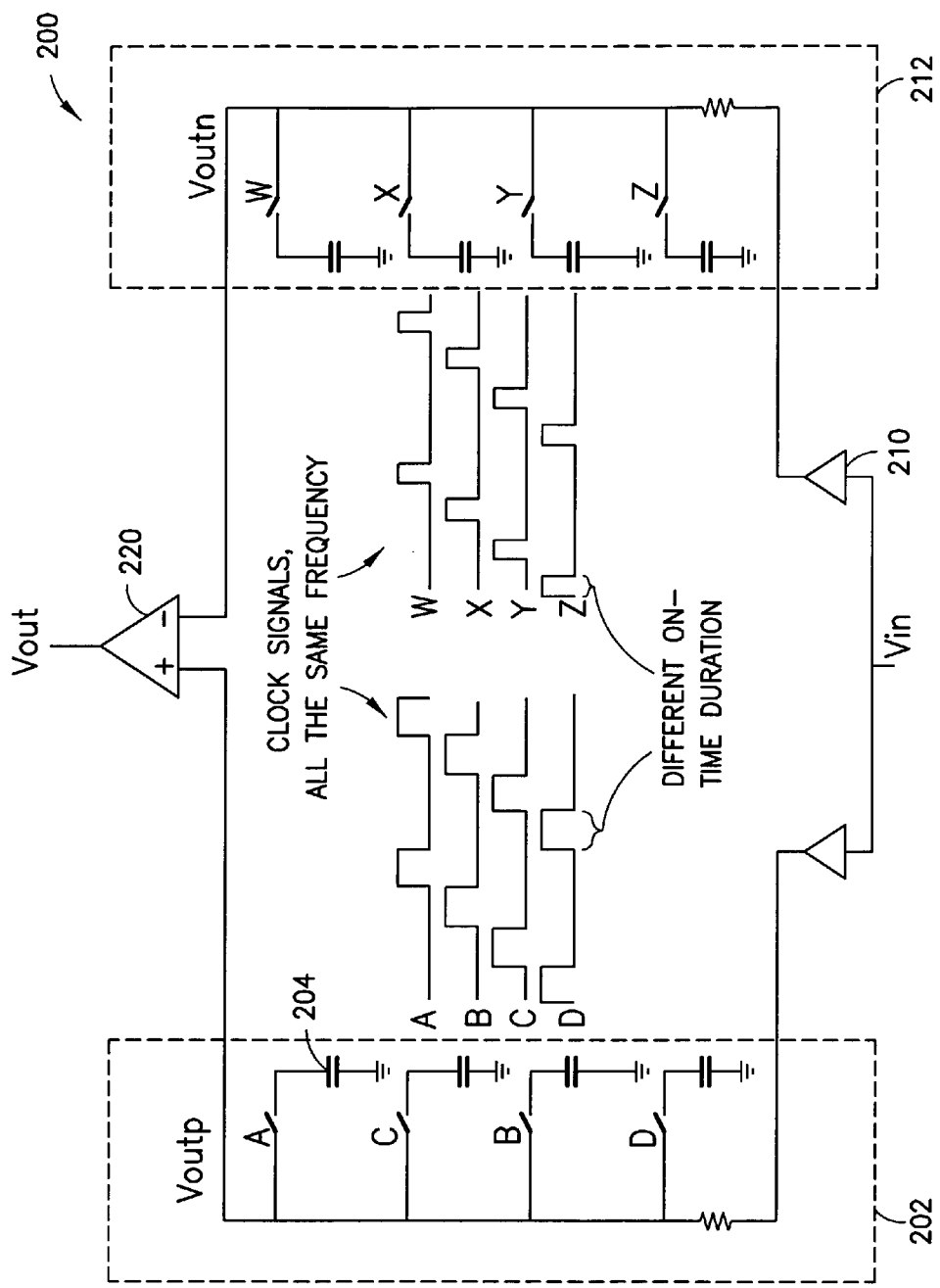
FIG. 2 is an electronic schematic diagram of a dual N-path tracking filter according to an exemplary embodiment of these teachings.

These teachings take a different approach. Rather than two filters with shifted center frequencies. FIG. 2 illustrates an exemplary embodiment of a tracking filter implemented as two four-phase N-path filters all running on the same frequency. This is but one arrangement; there may be more or less than four paths/phases, and/or there may be more than two N-path filters in parallel in other implementations. A high out-of-band rejection may be obtained not by shifting the center frequency but by shifting the amplitude of the response at the center frequency and then taking the difference of filter responses as the final output response. The amplitude of the filter response may be shifted by varying the on-time of the each active phase of the clock.

With reference to FIG. 2, a first filter branch 202 and a second filter branch 212 each have N=4 paths, each path having a switch and a capacitor. In other embodiments the capacitor may be replaced by series or parallel components, such as an RC (resistor-capacitor) sub-circuit, an LC (inductor-capacitor) tank sub-circuit, an RLC (resistor-inductor-capacitor) sub-circuit, or combinations of any of those alternatives to name a few non limiting examples. In general, one can refer to each path as defining a sub-circuit 204 which is switched into and out of the respective filter/branch 202, 212, and in the example tracking circuit of FIG. 2 all of those sub-circuits 204 are identical.

Consider the first filter branch 202. Four switches A, B, C and D may be provided, each on a different path and each selectively controlled by the same clock signal but at different phases. This is shown in the clock signal profile at FIG. 2 adjacent to the first filter branch 202. Clock signal A controls the switch A, clock signal B controls the switch B, etc. Since each path of a given filter branch 202, 212 is switched open and closed by the same clock signal but at different phases, the switches and thus the N paths may operate on identical frequencies. The clock signal profiles for paths A, B, C and D also show they each have the same on-time, meaning the amplitude of the signal when any one of these paths is switched closed is the same as that for any other path on this same filter branch 202. Consider this a first on-time duration. Only the phase may differ among the paths on the same filter branch 202.

Considering the second filter branch 212, four switches W, X, Y and Z may be provided. Each of these switches may also be on a different path and they may also be all controlled by a single clock signal but at different phases, also as shown in the clock signal profile at FIG. 2 adjacent to the second filter branch 212. Like the first filter branch 202, in the second filter branch 212 the clock signal W may control switch W, clock signal X controls switch X, etc. And like the first filter branch 202, since each path of the second filter branch 212 is driven by the same clock signal they all have identical frequencies. The signal profiles for paths W, X, Y and Z also show they each may have the same on-time, meaning the amplitude of the signal when any one of these paths is switched closed is the same as that for any other path on this same filter branch 212. Consider this a second on-time duration. Like the first filter, only the phase differs among the paths on the same filter branch 212.

Now consider similar paths on the different filter branches 202, 212. The clock signal controlling the switches A, B, C and D of the first filter branch 202 maybe at the same frequency as the clock signal controlling the switches W, X, Y and Z of the second filter branch 212. From the clock signals at FIG. 2 we see that paths A and W may be at the same phase; paths B and X may be at the same phase, paths C and Y may be at the same phase, paths D and Z may be at the same phase. The salient difference between each of these same-phase paths on the parallel filter branches 202, 212 may be that they are driven by different on-times, meaning the amplitude of the signal they output when that respective switch is closed differs from one another despite identical frequency, phase and sub-circuit being switched in and out of the respective filter branches 202, 212. According to the exemplar) on-times shown at FIG. 2, for any pair of same-phase paths, signals from the path switched-in at the first filter 202 branch may exhibit larger amplitude than signals from the path switched-in at the second filter branch 212.

The output of the two individual filters/branches 202, 212 may be additively combined at 220 such that the signal amplitude from the second filter branch 212 may be subtracted from that of the first filter branch 202 to achieve the output signal $V_{out}$. The FIG. 2 implementation is for a single-ended signal, where there may be a single input signal $V_{in}$ split into two parts and each part is passed through one of the filter branches 202, 212 after being amplified by amplifier 210.

The local oscillator providing the clock signals to all of these switches A, B, C, D, W, X, Y and Z may be tuned to different frequencies, to different on-times, and to different phases so the N-phase N-path multi filters in parallel may be tuned over quite a wide bandwidth when implemented in the RF front end chip near the antenna. The frequencies may be identical so the fact that they would pull toward each other if there were any difference may not be relevant. Since the filters are implemented in parallel there may not be added delay due to additional switching on the parallel filter.

Figure 3A:
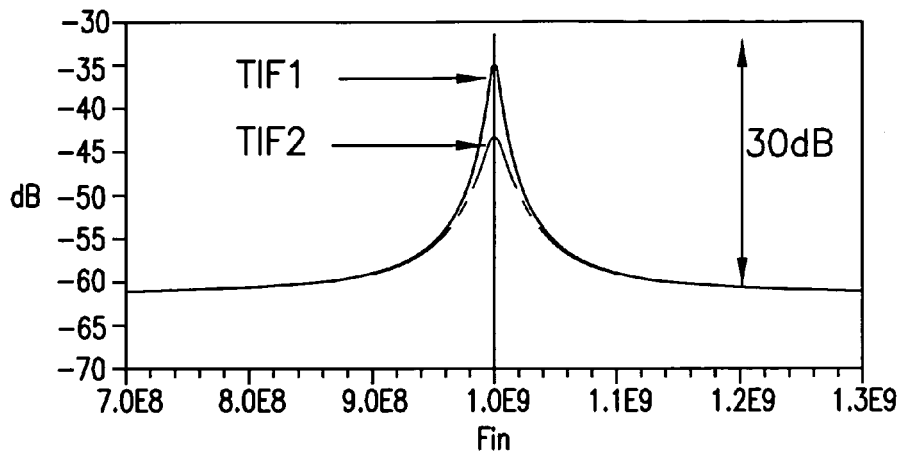
FIG. 3A plots the frequency response of the individual branches of the dual N-path tracking filter of FIG. 2.

FIG. 3A illustrates the frequency response of the two branches 202, 212 of the bandpass tracking filter 200 of FIG. 2 at 1 GHz for sidebands covering 300 MHz on each side of 1 GHz local oscillator/clock frequency. FIG. 3A illustrates two response curves, one for each of the two filter branches 202, 212, and corresponding to a clock having a duty cycle of 25% with on-time ($T_{on}$) of 23 ns and 17 ns respectively. At the center frequency the amplitudes are quite different, while both tail frequency responses are similar across both filters.

Figure 3B:
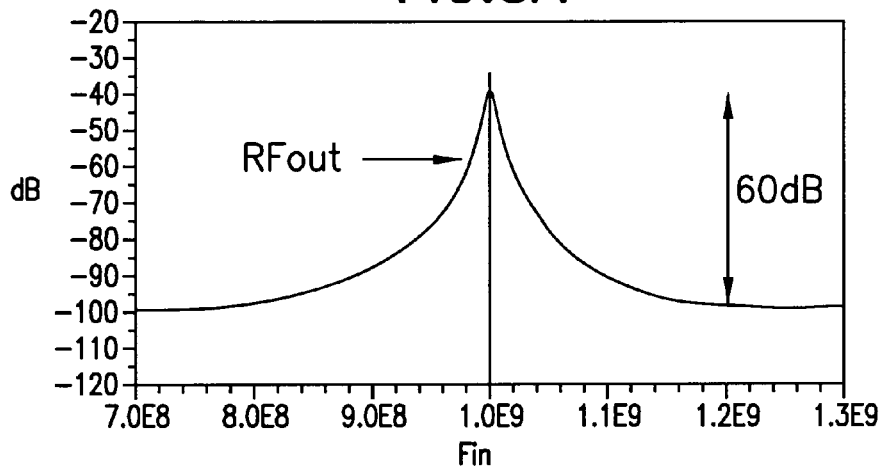
FIG. 3B plots the frequency response of the entire dual N-path tracking filter of FIG. 2 and shows its high out-of band rejection.

Taking the difference of these two FIG. 3A responses at the combiner 220 (FIG. 2) yields the total filter response illustrated at FIG. 3B. There it can be seen that the filter rejection from 700 MHz to 1 GHz is about 60 dB, whereas in the original filter response (one of the responses at FIG. 3A) it was less than 30 dB. A filter according to these teachings provides a significant improvement in the filter rejection characteristics as compared to that of FIG. 1.

Figure 4:
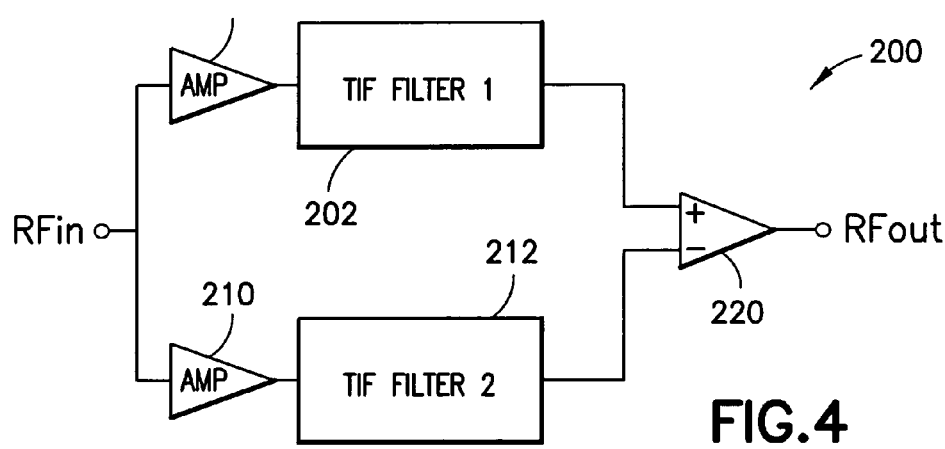
FIG. 4 is a high level hardware block diagram showing the output of a first filter of FIG. 2 being subtracted from the output of a second filter of FIG. 2 to achieve a differential output signal as plotted at FIG. 3B.

The general principle to achieve the FIG. 3B output from the individual filter responses at FIG. 3A-B is shown in the high level circuit diagram of FIG. 4. The first 202 and second 212 filters of the dual multi-phase N-path filter 200 are shown there using the same reference numbers as FIG. 2, and also shown are the amplifiers 210 for each filter branch 202, 212 as well as the combiner 220 to achieve the output shown at FIG. 3B.

While FIG. 2 and the accompanying performance plots at FIGS. 2 and 3 utilized a single-ended signal (a single $V_{in}$ and $V_{out}$), the filter 200 of FIG. 2 may be easily converted in other embodiments to a differential version for differential signals at the input and/or at the output. For the case of a differential input and single-ended output, the two phases of the differential input signal may be applied to two single-ended branches without any need for splitting the input signal, and each input signal $V_{in1}$ and $V_{in2}$ may input separately to the different amplifiers 210 shown in FIG. 2. For such differential inputs and outputs, the first 202 and second 212 filter branches may be considered to have inputs and outputs where the signal pathway penetrates the dotted lines for 202 and 212 in FIG. 2.

Figure 5:
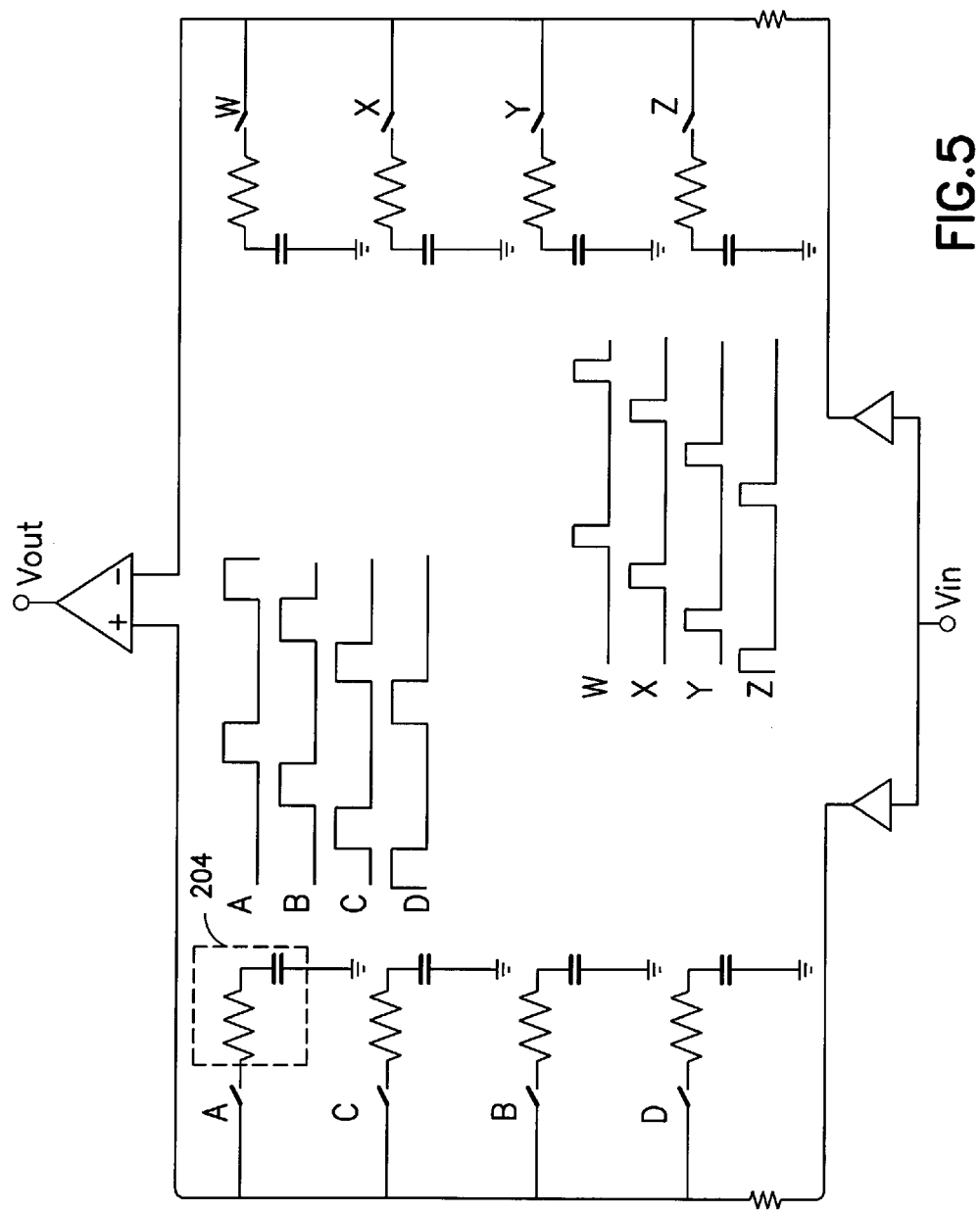
FIG. 5 is an electronic schematic diagram of a dual N-path tracking filter according to further exemplary embodiments of these teachings.

FIG. 5 illustrates a first set of alternative embodiments of a dual N-path tracking filter according to these teachings. The FIG. 5 embodiment may be substantially identical to that of FIG. 2, with the exception that in the sub-circuit 204 of FIG. 5, each path that is switched in or out of the filter may be a series RC circuit rather than only a capacitor as shown in FIG. 2. As noted above other implementations of the sub-circuit 204 may be a LC circuit or a RLC circuit or other components in parallel or series.

Figure 6:
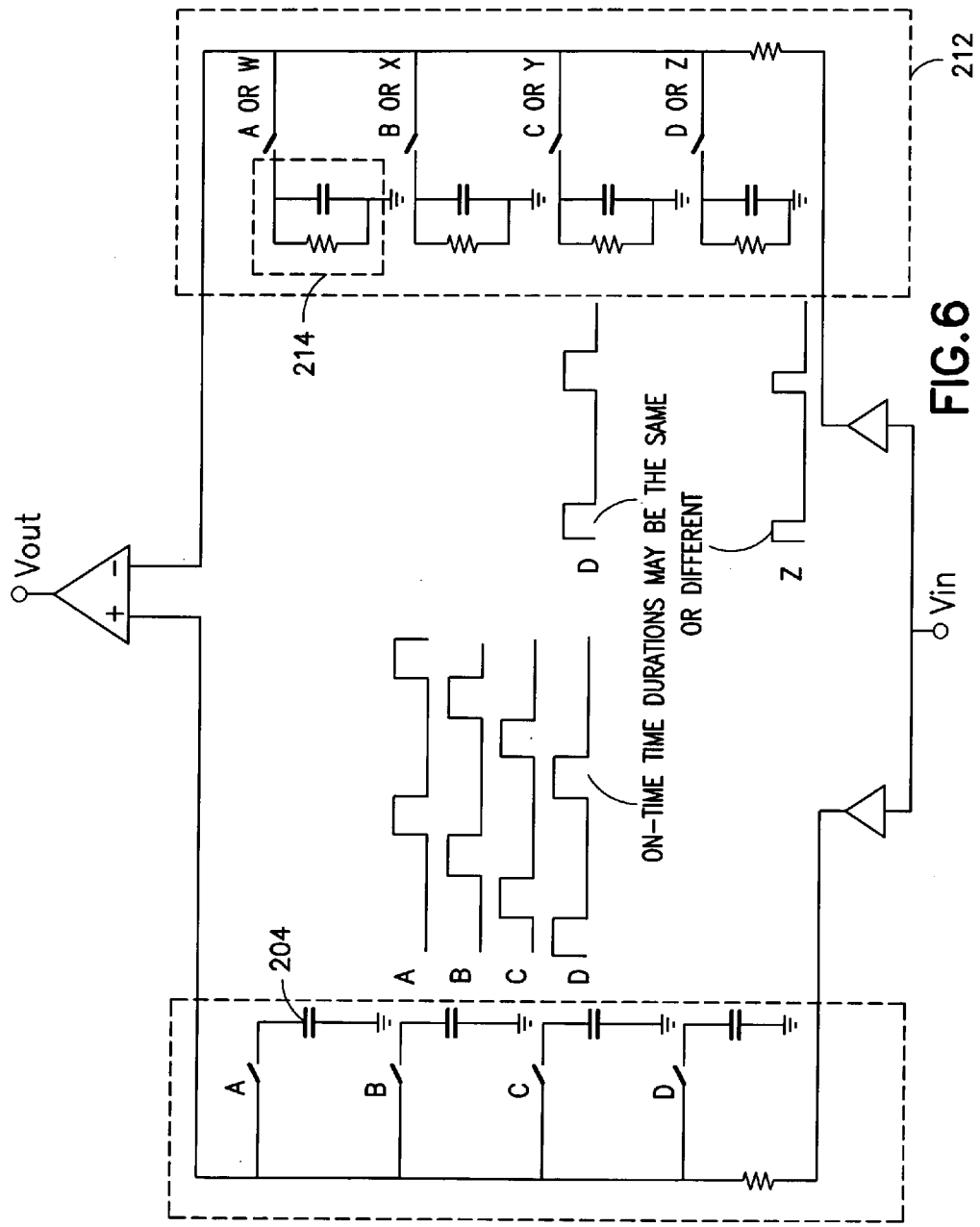
FIG. 6 is an electronic schematic diagram of a dual N-path variable bandwidth tunable RF tracking filter according to further exemplary embodiments of these teachings.

In the exemplary tracking circuits of FIGS. 2 and 5, the sub-circuits of each branch on both the first filter branch 202 and the second filter branch 212 are identical. This is not a necessary limitation for all implementations as proved by a further exemplary tracking circuit shown in FIG. 6. At FIG. 6, the sub-circuits 204 on each path of the first filter branch 202 are all identical to one another and shown by example as only a capacitor. For convenience we can refer to these as a first sub-circuit. The sub-circuits 214 on each path of the second filter branch 212 are all identical to one another and shown by example as a parallel R-C sub-circuit, and similarly for convenience we can refer to these as a second sub-circuit. FIG. 6 thus shows that the first sub-circuit 204 which is on the paths of the first filter branch 202 is different from the second sub-circuit 214 which is on the paths of the second filter branch 212.

In the FIG. 6 embodiment the on-time durations of the clock signals that control the respective first filter branch 202 and second filter branch 212 may be different as was detailed above for FIGS. 2 and 5, but in another embodiment since the sub-circuits 204, 214 in the filter branches 202, 212 are different the same result as FIGS. 2 and 5 may be achieved even if the on-time durations are the same. Thus if we consider that a) for the first filter branch 202 there is a first sub-circuit 204 and a clock signal is applied having a first on-time duration, and b) for the second filter branch 212 there is a second sub-circuit 214 and a clock signal is applied having a second on-time duration, then according to the different embodiments detailed among FIGS. 2, 5 and 6 it may be that the first and second on-time durations are different, or the first and second sub-circuits are different, or both on-time durations and sub-circuits are different.

The illustrative filter configurations of FIGS. 2, 5, and 6 maybe employed to implement a radio frequency (RF) tracking filter that has high out-of-band rejection by using two four phase N-path filters. Adjusting the RF tracking may be accomplished by shifting the amplitude of the response at the center frequency and taking the difference of filter responses of the two filter branches as the final output response. The amplitude of the filter response is shifted by varying the on-time of each active phase of the clock, or by having different combinations of components in the two branches of the filter as shown in FIG. 6.

The filter configuration of FIG. 6 may be employed to provide a filter having an adjustable bandwidth in addition to, or in lieu of, adjustable RF tracking. Such an adjustable bandwidth filter is implemented by providing a first filter branch comprising a first RC N-path filter and a second filter branch comprising a second RC N-path filter. The output of the first filter branch is subtracted from the output of second filter branch to provide a filtered signal, or the output of the second filter branch is subtracted from the output of the first filter branch to provide the filtered signal. The first filter branch includes a plurality of switched RC networks, while the second filter branch includes a plurality of respective switched parallel RC networks each including a corresponding adjustable resistor in parallel with a capacitor. The center frequency of the filter is determined by the frequency at which the switches are clocked, and the bandwidth of the filter is determined by the values of the resistors and capacitors in the RC networks.

Figure 7:
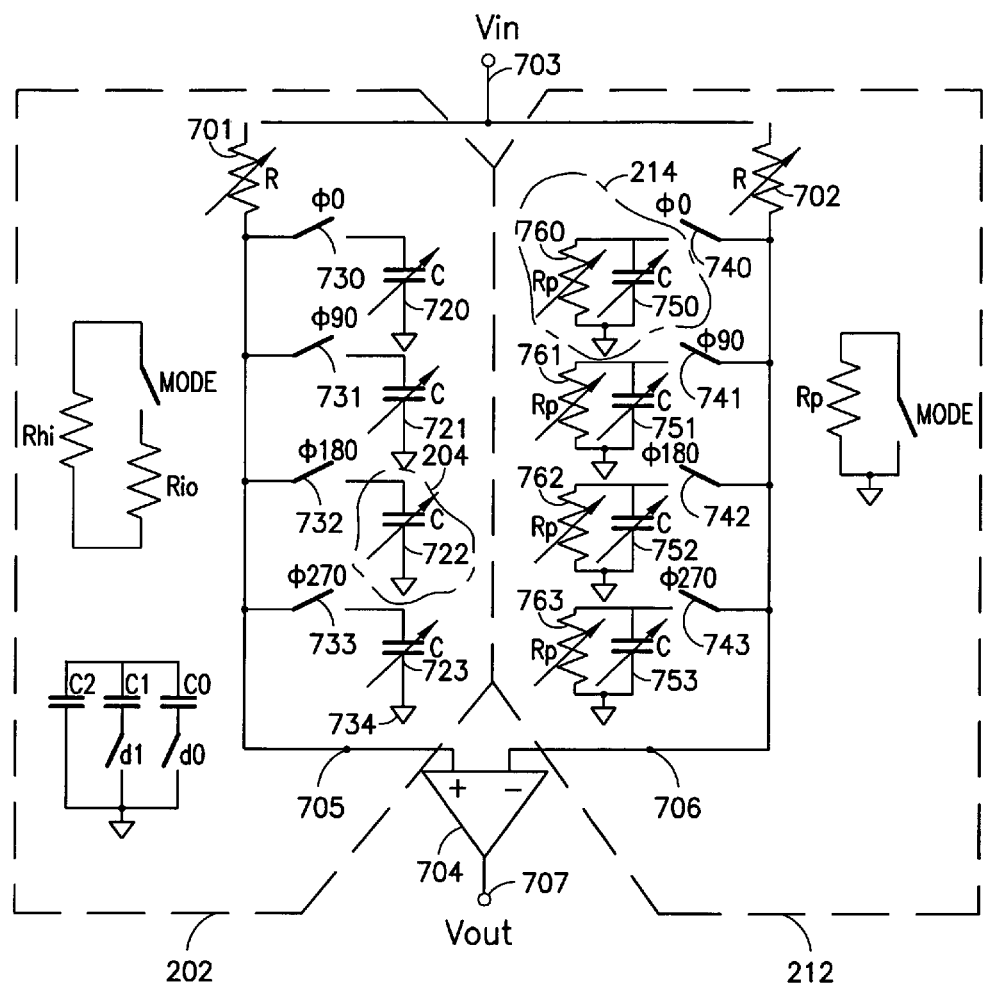
FIG. 7 is a more detailed electronic schematic diagram of the dual N-path variable bandwidth tunable RF tracking filter of FIG. 6 according to further exemplary embodiments of these teachings.

FIG. 7 is a more detailed electronic schematic diagram of the dual N-path variable bandwidth tunable RF tracking filter of FIG. 6 according to further exemplary embodiments of these teachings. Although N=4 in the present exemplary embodiment, N can be any integer greater than one. The variable bandwidth radio frequency tracking filter comprises a first filter branch 202 (FIGS. 6 and 7) and a second filter branch 212 (FIGS. 6 and 7). The first filter branch 202 comprises a first adjustable resistor 701 in series with an input 703 (FIG. 7) and a first output 705, and a first plurality of N parallel paths across the first output 705. Each of respective paths of the first plurality of N parallel paths comprises a corresponding adjustable capacitor 720, 721, 722, 723 in series with a corresponding switch 730, 731, 732, 733 and a common terminal 734.

A second filter branch comprises a second adjustable resistor 702 in series with the input 703 and a second output 706, and a second plurality of N parallel paths across the second output 706, each of respective paths of the second plurality of N parallel paths comprising a corresponding parallel RC network in series with a corresponding switch 740, 741, 742, 743 and the common terminal 734. Each corresponding parallel RC network includes a respective adjustable capacitor 750, 751, 752, 753 in parallel with a corresponding adjustable resistor 760, 761, 762, 763.

A clock tunes the first and second filter branches 202, 212 to a center frequency by controlling the switches 730, 731, 732, 733, 740, 741, 742, 743 of the first and second filter branches to switch at the center frequency. A combiner 704 produces an output 707 in the form of a difference signal comprising a difference between the output 705 of the first filter branch 202 and the output 706 of the second filter branch 212; the difference signal providing a filter bandwidth with reference to the center frequency. The filter bandwidth is adjusted by changing a value of at least one adjustable resistor or at least one adjustable capacitor in one or more of the first filter branch 202 or the second filter branch 212.

In order to achieve bandwidth tunability, a first or wide-bandwidth mode and a second or narrow-bandwidth mode may be provided changing the values of adjustable resistor 701 and adjustable resistor 760 as shown in FIG. 7. In narrow-bandwidth mode, adjustable resistor 701 is set to a relatively large value, which provides narrow filtering without requiring prohibitively large capacitors. In the wide-bandwidth mode, adjustable resistor 701 is set to a smaller value than for the narrow-bandwidth mode, which provides a filter that is operable at high center frequencies in the GHz range. One or more of the adjustable capacitors 720, 721, 722, 723, 730, 731, 732, or 733 may be implemented as a capacitor bank wherein the capacitance is controlled and adjusted using digital bits. The capacitor bank provides finer bandwidth tuning within each bandwidth mode. An exemplary embodiment f a capacitor bank in FIG. 7 has been illustrated with three capacitors C0, C1 and C2 and switches d0 and d1. There could be any number of capacitors in the capacitor bank.

Figure 8:
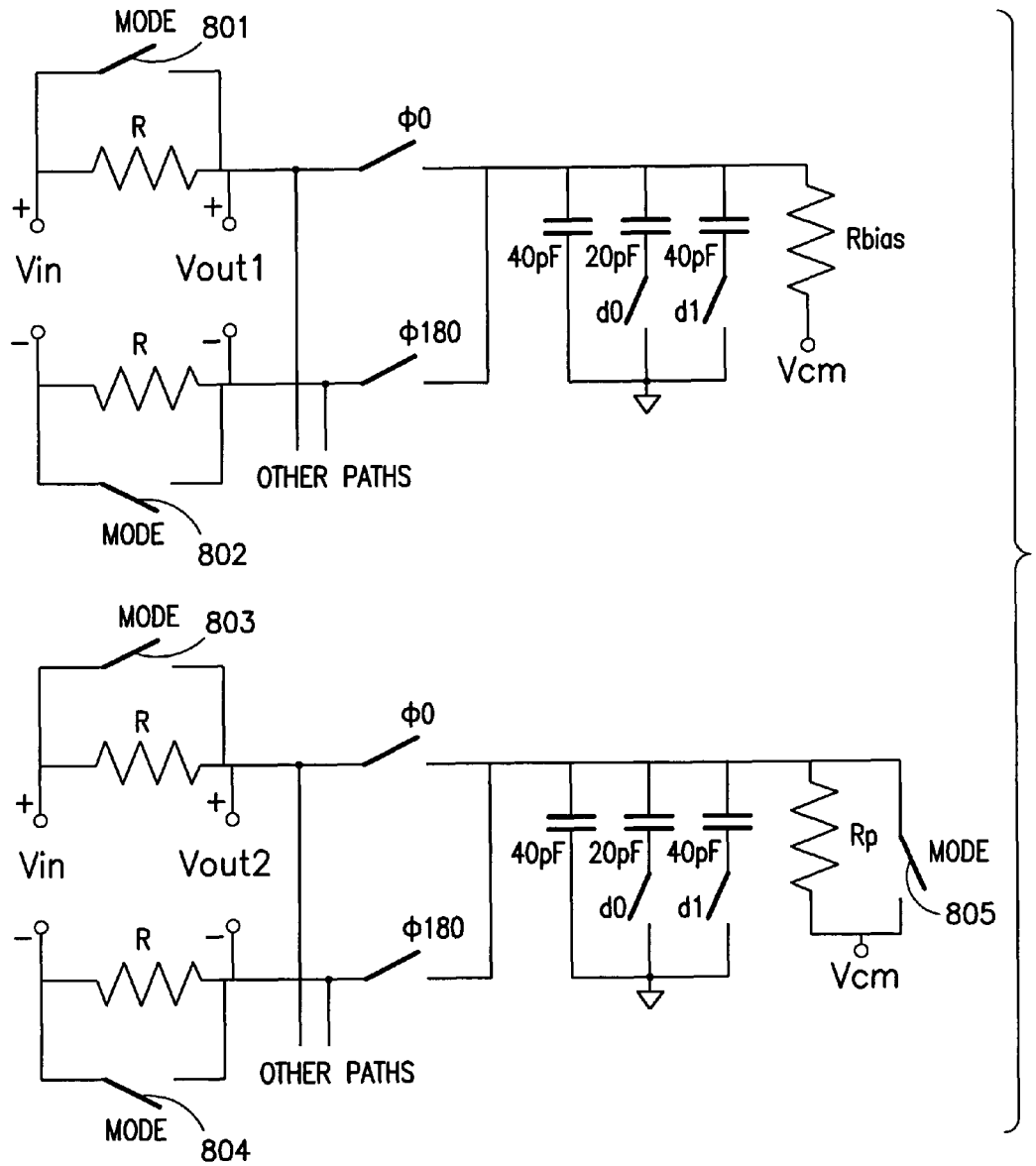
FIG. 8 is an electronic schematic diagram illustrating exemplary paths of the dual N-path variable bandwidth tunable RF tracking filter of FIG. 7 according to further exemplary embodiments of these teachings.

FIG. 8 is an electronic schematic diagram illustrating exemplary paths of a differential-mode implementation of the dual N-path variable bandwidth tunable RF tracking filter of FIG. 7 according to further exemplary embodiments of these teachings. One or more mode switches 801, 802, 803, 804, 805 are provided to enable the filter bandwidth to be selected. For example, the mode switches 801, 802, 803, 804 and 805 are opened to provide narrow bandwidth operation and closed to provide wide bandwidth operation. Each of respective switches 801, 802, 803, 804 and 805 are placed in shunt across a corresponding resistor 811, 812, 813, 814 and 815 to effectively short out the resistor when the respective switch is closed.

Figure 9A:
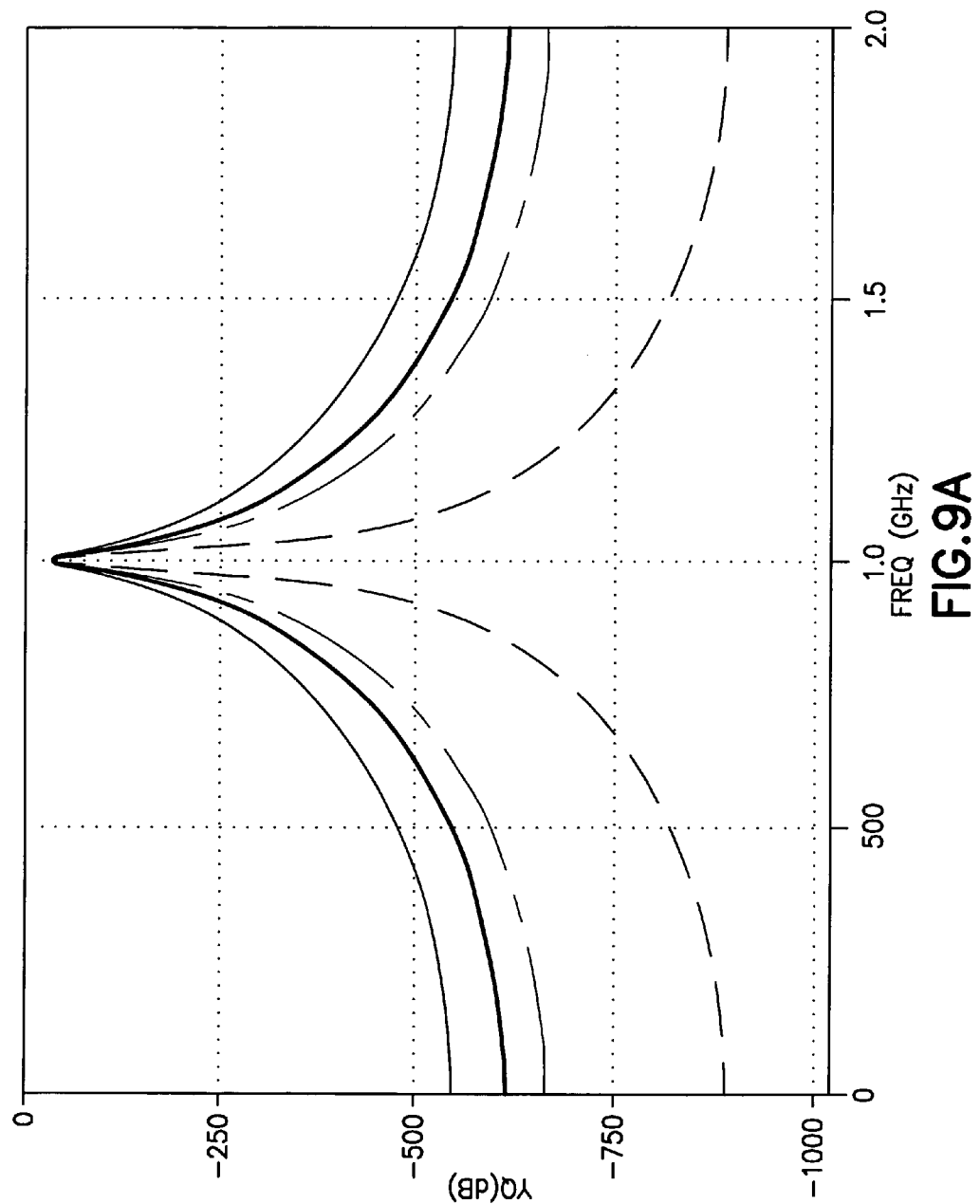
FIG. 9A plots the frequency responses of a plurality of bandwidth configurations for any of the filters shown in FIGS. 6 and 7.
Figure 9B:
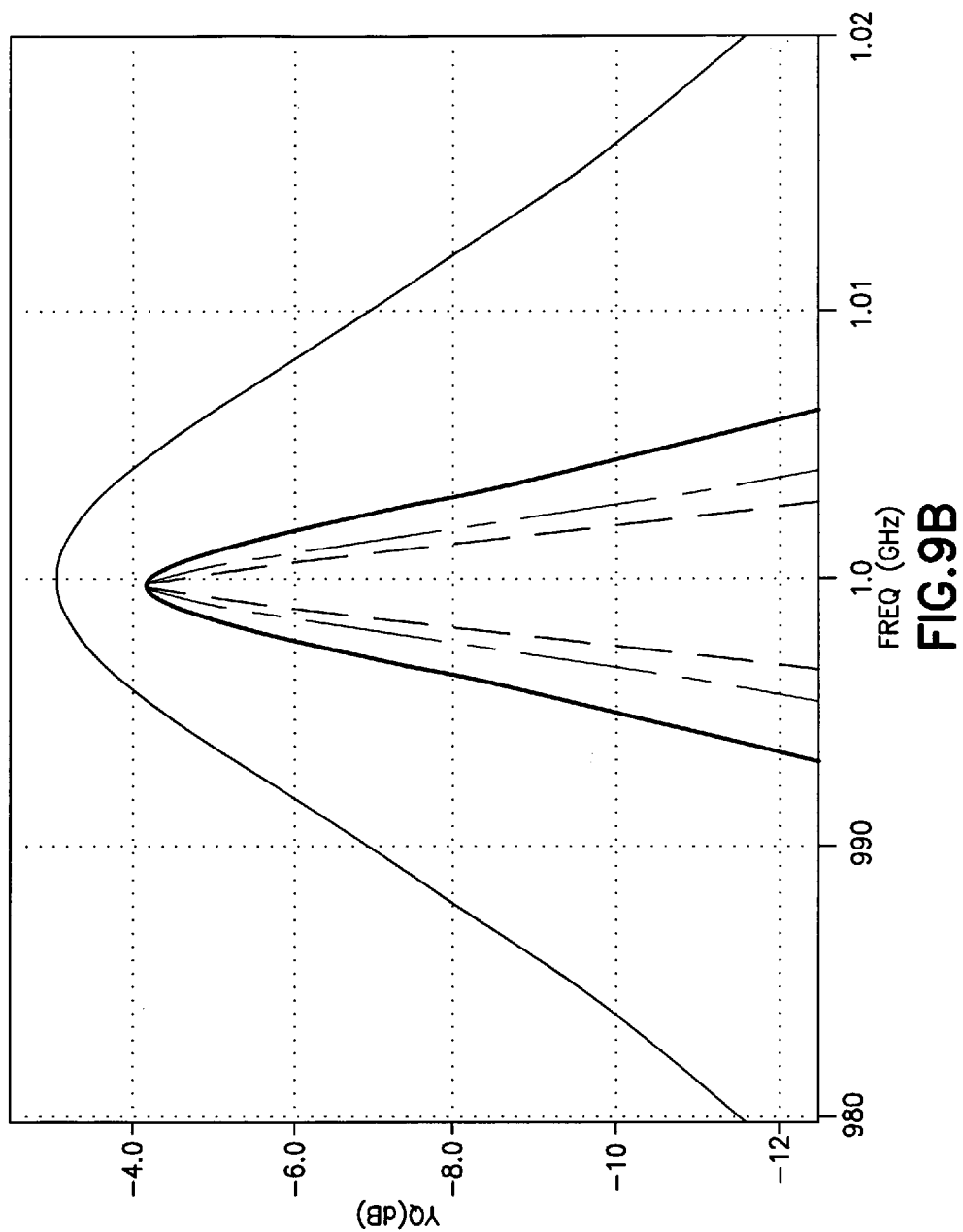
FIG. 9B is an exploded view of the frequency response plot of FIG. 9A.
Figure 10:
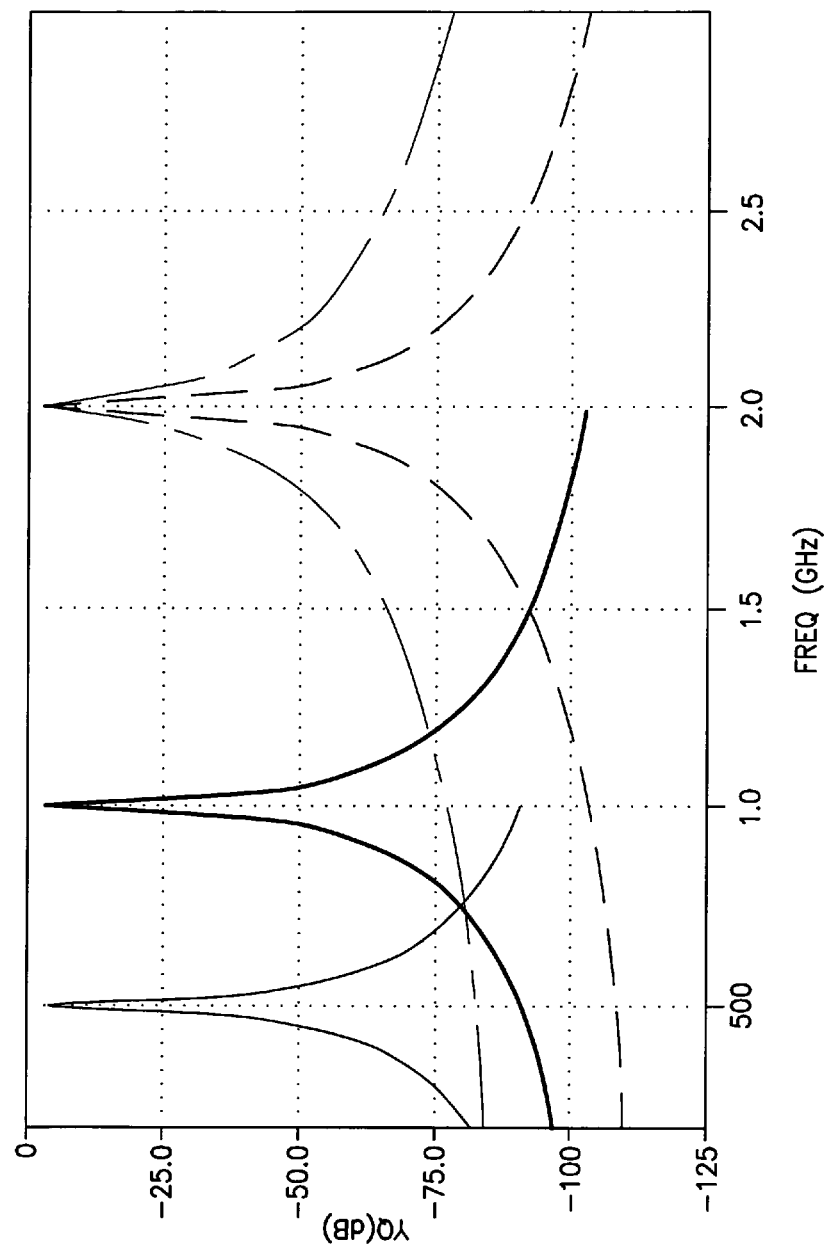
FIG. 10 plots the frequency responses of a plurality of bandwidth configurations for a plurality of center frequencies for any of the filters shown in FIGS. 6 and 7.

FIG. 9A plots the frequency responses of a plurality of bandwidth configurations for any of the filters shown in FIGS. 6 and 7. FIG. 9B is an exploded view of the frequency response plot of FIG. 9A. FIG. 10 plots the frequency responses of a plurality of bandwidth configurations for a plurality of center frequencies for any of the filters shown in FIGS. 6 and 7. FIGS. 9A. 9B, and 10 were prepared using simulation results from a variable bandwidth filter prototype which uses 2 bandwidth modes and 2 bits of capacitor tuning, yielding 8 possible bandwidth configurations ranging from 2 MHz to 25 MHz. Enhanced configurability can be easily added by providing more bits of tuning in the adjustable capacitors 720, 721, 722, 723 (FIG. 7) and/or adjustable resistors 701, 760, 761, 762, 763. Furthermore, a 4-path single-ended Delta TIF is shown in FIG. 7, but the same frequency and bandwidth tuning concepts apply to any N-path structure, both in the a single-ended configuration and in a differential-mode configuration. In practice, the differential-mode configuration of FIG. 7 is preferred because of several advantages associated with a differential signal.

The tracking of the variable bandwidth filter with the clock frequency is shown in FIG. 10. The output response of the variable bandwidth filter at two different bandwidths is illustrated. It is observed that the filter bandwidth remains substantially constant while the clock is varied for changing the center frequency of the filter.

Figure 11:
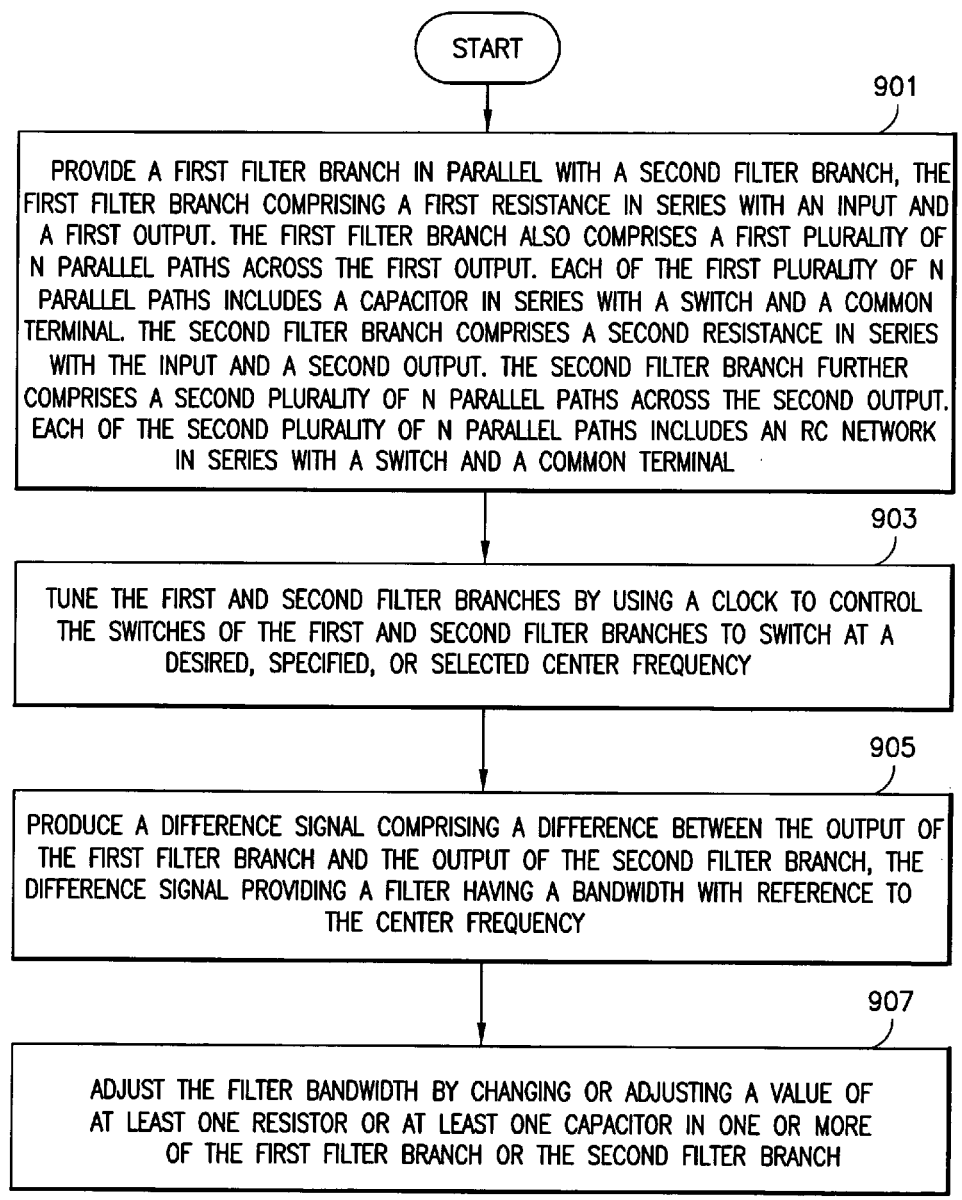
FIG. 11 is a process flow diagram that illustrates a method, and a result of execution by one or more processors of a set of computer program instructions embodied on a computer readable memory, for operating a circuit/filter in accordance with the exemplary embodiments of this invention.

FIG. 11 is a process flow diagram that illustrates a method, and a result of execution by one or more processors of a set of computer program instructions embodied on a computer readable memory, for operating a variable bandwidth filter in accordance with the exemplary embodiments of this invention. The operational sequence commences at block 901 where a first filter branch and a second filter branch are provided, the first filter branch being in parallel with the second filter branch. The first filter branch comprises a first resistance in series with an input and a first output. The first filter branch further comprises a first plurality of N parallel paths across the first output, each of respective paths of the first plurality of N parallel paths comprising a corresponding capacitor in series with a corresponding switch and a common terminal. A second filter branch comprises a second resistance in series with the input and a second output. The second filter branch further comprises a second plurality of N parallel paths across the second output, each of respective paths of the second plurality of N parallel paths comprising a corresponding RC network in series with a corresponding switch and a common terminal.

Next, at block 903, a clock tunes the first and second filter branches to a center frequency by controlling the corresponding switches of the first and second filter branches to switch at the center frequency. For example, a first switch in the first filter branch and a second switch in the second filter branch may be selectively controlled with clock signals having a same frequency and a same phase and respective first and second on-time durations. As was detailed by the examples discussed previously, a) the first and second on-time durations may be different, b) the first and second sub-circuits may be different, or c) both on-time duration and sub-circuits may be different.

Alternatively, or additionally, selectively controlling the switches in the first and second filter branches may comprise controlling all the switches of the N paths in the first filter branch and the second filter branch with clock signals having the same frequency and the same on-duration but a plurality of different phases, such that each of respective switches in the first filter branch is paired with a corresponding switch of the switches in the second filter branch according to clock signals having a common phase. Alternatively or additionally, clock signals applied to the first filter branch may provide a first on-time duration that is different from a second on-time duration of clock signals applied to the second filter branch.

The operational sequence of FIG. 11 progresses to block 905 where a combiner produces a difference signal comprising a difference between the output of the first filter branch and the output of the second filter branch; the difference signal providing an adjustable bandwidth filter having a bandwidth determined with reference to the center frequency. Next, at block 907, the filter bandwidth is adjusted by changing or adjusting a value of at least one resistor or at least one capacitor in one or more of the first titter branch or the second filter branch.

The various steps and messages summarized in FIG. 11 may be viewed as method steps, and/or as operations that result from operation of computer program code embodied on a memory and executed by a processor, and or as a plurality of coupled logic circuit elements constructed to carry out the associated function(s).

Figure 12:
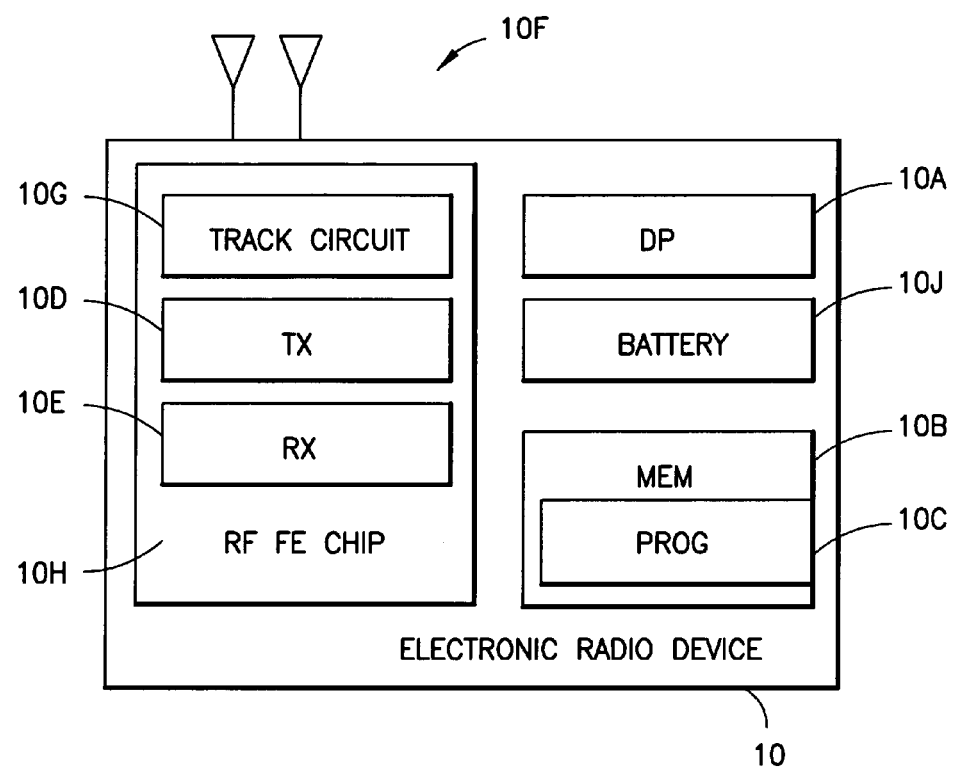
FIG. 12 is a simplified block diagram of an exemplary electronic device, such as a user equipment or a network access node, which is suitable for use in practicing the exemplary embodiments of the invention.

FIG. 12 is a simplified block diagram of an exemplary electronic device, such as a user equipment or a network access node, which is suitable for use in practicing the exemplary embodiments of the invention. The variable bandwidth filters described herein may be disposed in a mobile user terminal, or in a network base station, or in a local wireless hotspot, or other such radio devices. Pursuant to one set of illustrative embodiments, the variable bandwidth filter is provided in a mobile handset, or in a network node such as a base station or access point (more generally an electronic radio device), between an antenna and one or both of a receiver and a transmitter. The variable bandwidth filter may, but need not, be advantageously embodied in CMOS on a RF front end chip.

Reference is made to FIG. 12 for illustrating a simplified block diagram of an electronic device suitable for embodying the variable bandwidth filter according to these teachings. For example, such an electronic radio device may be a mobile phone/user terminal more generally referred to as a user equipment (UE), or it may be a network access node such as a Node B (base station), an eNB, or a local area network access point. For example, a DE may be any portable radio device intended for an end user which accesses a wireless network such as a cellular or WLAN network. Specific examples of a UE include but are not limited to: cellular telephones, personal digital assistants (PDAs) having wireless communication capabilities, portable computers (laptops, tablets, etc.) having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

Embodiments of a network access node include but are not limited to cellular base stations, relay stations, remote radio heads, WLAN access points, and any other type of network node with wireless communication capability and which serves as an access portal enabling any of the above types of UEs to gain access to the wireless network of whatever specific type of radio access technology.

The device 10 may include a controller, such as a computer or a data processor (DP) 10A, a computer-readable memory medium embodied as a memory (MEM) 10B that stores a program of computer instructions (PROG) 10C, and a suitable radio frequency (RF) transmitter (TX) 10D and receiver (RX) 10E for bidirectional wireless communications over the air via one or more antennas 10F (two shown). The device 10 may have one or more than one radios 10D/10E for communicating with other radio devices or the same or different type. The circuit shown by example in FIGS. 2 and 5 above is shown in FIG. 12 as a tracking circuit 10G, disposed on the RF front end (FE) chip 10H between the antennas 10F and the transmitter or receiver. Particularly when embodied within a UE but also in case there is a backup DC power supply for a network access node, the electronic device in which such a tracking circuit 10G may be disposed may also be powered by a portable power supply 10J such as a battery or a fuel cell for example.

Since this circuit may be deployed in a software defined radio, at least one of the PROGs 10C may be assumed to include program instructions that, when executed by the associated DP, enable the device to operate in accordance with the exemplary embodiments of this invention, as detailed above. That is, the exemplary embodiments of this invention may be implemented at least in part by computer software executable bye the DP 10A of the device 10, or by hardware, or by a combination of software and hardware (and firmware). For the software defined radio, the parameters for driving the local oscillator to provide the appropriate clock signal for controlling the switches so as to set the center frequency and suitable band exclusion cutoffs may be stored in the memory and applied to the local oscillator according to a program which selects from the memory the appropriate parameter set for a given radio and the frequencies being used.

For completeness the computer readable MEM 10B may be of any type suitable to the local technical environment and may be implemented using any suitable data storage technology, such as semiconductor based memory devices, flash memory, magnetic memory devices and systems, optical memory devices and systems, fixed memory and removable memory. The DP 10A may be of any type suitable to the local technical environment, and may include one or more of general purpose computers, special purpose computers, microprocessors, digital signal processors (DSPs) and processors based on a multicore processor architecture, as non-limiting examples.

Among the technical effects of these teachings, the variable bandwidth filters described herein meet or exceed the out-of-band signal rejection specifications of SAW filters with the additional advantage that these variable bandwidth filters may be integrated into the RF transceiver chips. This integration will result into elimination of several band-specific, bulky and costly SAW filters from the handsets. Also, the variable bandwidth filters described herein are tracking filters; therefore, these filters will enable the implementation of reconfigurable multiband radios with variable bandwidth such as required for LTE. In present handsets, many duplexers are used depending on the number of receive/transmit bands and their bandwidths. The variable bandwidth filter described herein may be used to replace these duplexers with a single re-configurable filter that tracks the receive frequency and has a variable bandwidth.

In general, the various exemplary embodiments may be implemented in hardware or special purpose circuits, software, logic or any combination thereof. For example, some aspects may be implemented in hardware, while other aspects may be implemented in embodied firmware or software which may be executed by a controller, microprocessor or other computing device, although the invention is not limited thereto. While various aspects of the exemplary embodiments of this invention may be illustrated and described as block diagrams, flow charts, or using some other pictorial representation, it is well understood that these blocks, apparatus, systems, techniques or methods described herein may be implemented in, as non-limiting examples, hardware, embodied software and/or firmware, special purpose circuits or logic, general purpose hardware or controller or other computing devices, or some combination thereof, where general purpose elements may be made special purpose by embodied executable software.

It should thus be appreciated that at least some aspects of the exemplary, embodiments of the inventions may be practiced in various components such as integrated circuit chips and modules, and that the exemplary embodiments of this invention may be realized in an apparatus that is embodied as an integrated circuit. The integrated circuit, or circuits, may comprise circuitry (as well as possibly firmware) for embodying at least one or more of a data processor or data processors, a digital signal processor or processors, baseband circuitry and radio frequency circuitry that are configurable so as to operate in accordance with the exemplary embodiments of this invention.

While the exemplary embodiments have been described above in the context of an E-UTRAN multi-radio/software-defined radio device, it should be appreciated that the exemplary embodiments of this invention are not limited for use with only this one particular type of wireless communication system that uses resource allocations for scheduling data.

Furthermore, some of the features of the various non-limiting and exemplary embodiments of this invention may be used to advantage without the corresponding use of other features. As such, the foregoing description should be considered as merely illustrative of the principles, teachings and exemplary embodiments of this invention, and not in limitation thereof.

We claim:

1. A variable-bandwidth filter comprising:
   a first filter branch in parallel with a second filter branch;
   the first filter branch comprising a first resistance in series with an input and a first output, and a first plurality of N parallel paths across the first output, each of respective paths of the first plurality of N parallel paths comprising a corresponding capacitor in series with a corresponding switch and a common terminal;
   the second filter branch comprising a second resistance in series with the input and a second output, and a second plurality of N parallel paths across the second output, each of respective paths of the second plurality of N parallel paths comprising a corresponding resistor-capacitor (RC) network in series with a corresponding switch and a common terminal;
   a clock tuning the first and second filter branches to a center frequency by selectively controlling with clock signals the switches of the first and second filter branches to switch at the center frequency, in which the clock signals that selectively control all the switches of the N parallel paths in the first filter branch have a same frequency and a different phase with reference to the clock signals that selectively control all the switches of the N parallel paths in the second filter branch, and in which the clock signals of the first filter branch have a first on-time duration that is different than a second on-time duration of the clock signals of the second filter branch;
   a combiner for producing a difference signal comprising a difference between the first output of the first filter branch and the second output of the second filter branch; and
   the difference signal providing a filter output for the variable bandwidth filter wherein the filter bandwidth is adjusted with reference to a center frequency, the filter bandwidth being adjusted by changing a value of at least one resistor or at least one capacitor in one or more of the first filter branch or the second filter branch.

2. The variable-bandwidth filter according to claim 1, in which the clock signals that control the switches of the N paths in the first filter branch and the clock signals that control the switches of the N paths in the second filter branch all have the same frequency but have a plurality of different phases such that each switch in the first filter branch is paired with one of the switches in the second filter branch according to clock signals having a common phase.

3. The variable-bandwidth filter according to claim 2, further comprising a splitter for applying a same input signal to the input of the first filter branch and the input of the second filter branch.

4. The variable-bandwidth filter according to claim 1, in which N=4 and there are a total of four different phases of the clock signal selectively controlling the switches in the first filter branch and the switches in the second filter branch, in which the first plurality of N parallel paths and the second plurality of N parallel paths each use more than one phase.

5. The variable-bandwidth filter according to claim 1, in which a first sub-circuit is provided in each of the N parallel paths of the first filter branch, and a second sub-circuit is provided in each of the N parallel paths of the second filter branch, and the first sub-circuit is identical to the second sub-circuit.

6. The variable-bandwidth filter according to claim 1, in which a first sub-circuit is provided in each of the N parallel paths of the first filter branch, and a second sub-circuit is provided in each of the N parallel paths of the second filter branch, and the first sub-circuit is different from the second sub-circuit.

7. The variable-bandwidth filter according to claim 1, comprising a mode switch in each of the first filter branch and the second filter branch, in which the adjusting comprises the mode switch selecting the at least one resistor or at least one capacitor in the one or more of the first filter branch or the second filter branch to change a value of based on a bandwidth requirement of the filter output to at least reduce a band pass loss of the variable-bandwidth filter.

8. The variable-bandwidth filter according to claim 1, in which the tuning comprises shifting an amplitude of the first output of the first filter branch and the second output of the second filter branch at the center frequency, in which the filter output represents a difference between the shifted amplitude of the first output of the first filter branch and the shifted amplitude of the second output of the second filter branch.

9. The variable-bandwidth filter according to claim 1, in which the filter is operatively disposed in an electronic radio device between an antenna and one or both of a receiver and a transmitter.

10. The variable-bandwidth filter according to claim 1, in which the circuit is embodied in a radio frequency front end chip.

11. A method comprising:
    providing a variable-bandwidth filter comprising a first filter branch in parallel with a second filter branch; the first filter branch comprising a first resistance in series with an input and a first output, and a first plurality of N parallel paths across the first output, each of respective paths of the first plurality of N parallel paths comprising a corresponding capacitor in series with a corresponding switch and a common terminal; and the second filter branch comprising a second resistance in series with the input and a second output, and a second plurality of N parallel paths across the second output, each of respective paths of the second plurality of N parallel paths comprising a corresponding resistor-capacitor (RC) network in series with a corresponding switch and a common terminal;
    adjusting the variable-bandwidth filter by using a clock to tune the first and second filter branches to a center frequency by controlling the switches of the first and second filter branches to switch at the center frequency, in which controlling the switches in the first and second filter branches comprises selectively controlling all the switches of the N parallel paths in the first filter branch by applying clock signals to the first filter branch having a same frequency and a different phase with reference to clock signals that are applied to the second filter branch, and in which the clock signals applied to the first filter branch have a first on-time duration that is different than a second on-time duration of the clock signals applied to the second filter branch;
    producing a difference signal comprising a difference between the first output of the first filter branch and the second output of the second filter branch;
    the difference signal providing a filter output for the variable-bandwidth filter having an adjustable filter bandwidth with reference to a center frequency; and
    adjusting the filter bandwidth by changing a value of at least one resistor or at least one capacitor in one or more of the first filter branch or the second filter branch.

12. The method according to claim 11 wherein the first and second clock signals each comprise signals having the same frequency but a plurality of different phases such that each of respective switches in the first filter branch is paired with a corresponding switch of the switches in the second filter branch according to clock signals having a common phase.

13. The method according to claim 11, in which N=4 and there are a total of four different phases of the clock signal selectively controlling the switches in the first filter branch and the switches in the second filter branch, in which the first plurality of N parallel paths and the second plurality of N parallel paths each have more than one phase.

14. The method according to claim 11, in which each parallel path of the first filter branch comprises a first sub-circuit and each parallel path of the second filter branch comprises a second sub-circuit and the first sub-circuit is substantially identical to the second sub-circuit.

15. The method according to claim 11, in which each parallel path of the first filter branch comprises a first sub-circuit and each parallel path of the second filter branch comprises a second sub-circuit and the first sub-circuit is different from the second sub-circuit.

16. The method according to claim 11, further comprising a mode switch in each of the first filter branch and the second filter branch, in which the adjusting comprises the mode switch selecting the at least one resistor or at least one capacitor in the one or more of the first filter branch or the second filter branch to change a value of based on a bandwidth requirement of the filter output to at least reduce a band pass loss of the variable-bandwidth filter.

17. The method according to claim 11, in which the tuning comprises shifting an amplitude of the first output of the first filter branch and the second output of the second filter branch at the center frequency, in which the filter output represents a difference between the shifted amplitude of the first output of the first filter branch and the shifted amplitude of the second output of the second filter branch.

18. The method according to claim 11, in which the circuit is operatively disposed in an electronic radio device between an antenna and one of a receiver and a transmitter.

* * * * *